(12) United States Patent
Zhang

(10) Patent No.: US 6,687,895 B2
(45) Date of Patent: Feb. 3, 2004

(54) METHOD AND APPARATUS FOR REDUCING OPTICAL PROXIMITY CORRECTION OUTPUT FILE SIZE

(75) Inventor: Youping Zhang, Newark, CA (US)

(73) Assignee: Numerical Technologies Inc., San Jose, CA (US)

( * ) Notice: Subject to any disclaimer, the term of this patent is extended or adjusted under 35 U.S.C. 154(b) by 49 days.

(21) Appl. No.: 10/189,900

(22) Filed: Jul. 3, 2002

(65) Prior Publication Data

US 2004/0006756 A1 Jan. 8, 2004

(51) Int. Cl.[7] .............................................. G06F 17/50

(52) U.S. Cl. ................. 716/19; 716/21; 716/2

(58) Field of Search ................. 716/19–21, 2; 430/5

(56) References Cited

U.S. PATENT DOCUMENTS

| | | | |
|---|---|---|---|
| 5,182,718 A | 1/1993 | Harafuji et al. | 364/490 |
| 5,432,714 A | 7/1995 | Chung et al. | 364/525 |
| 5,533,148 A | 7/1996 | Sayah et al. | 382/240 |
| 5,538,815 A | 7/1996 | Oi et al. | 430/5 |
| 5,631,110 A | 5/1997 | Shioiri et al. | 430/5 |
| 5,657,235 A | 8/1997 | Liebmann et al. | 364/474.24 |
| 5,682,323 A | 10/1997 | Pasch et al. | 364/491 |
| 5,723,233 A | 3/1998 | Garza et al. | 430/5 |
| 5,815,685 A | 9/1998 | Kamon | 395/500 |
| 5,825,647 A | 10/1998 | Tsudaka | 364/167.03 |
| 5,885,734 A | 3/1999 | Pierrat et al. | 430/5 |
| 5,991,006 A | 11/1999 | Tsudaka | 355/53 |
| 6,009,250 A | 12/1999 | Ho et al. | 395/500.06 |
| 6,009,251 A | 12/1999 | Ho et al. | 395/500.06 |
| 6,011,911 A | 1/2000 | Ho et al. | 395/500.06 |
| 6,014,456 A | 1/2000 | Tsudaka | 382/144 |
| 6,064,806 A | 5/2000 | Lakos et al. | 395/500.04 |
| 6,077,310 A | 6/2000 | Yamamoto et al. | 716/19 |
| 6,081,658 A | 6/2000 | Rieger et al. | 395/500.22 |

(List continued on next page.)

FOREIGN PATENT DOCUMENTS

| | | |
|---|---|---|
| GB | 2324169 A | 10/1998 |
| JP | 3-80525 | 4/1991 |
| WO | WO 97/38381 A1 | 10/1997 |
| WO | WO 99/14636 A1 | 3/1999 |
| WO | WO 99/14637 A1 | 3/1999 |
| WO | WO 99/14638 A1 | 3/1999 |
| WO | WO 00/67074 A1 | 1/2000 |
| WO | WO 02/29491 A1 | 4/2002 |

OTHER PUBLICATIONS

Ackman, P., et al., "Phase Shifting and Optical Proximity Corrections to Improve CD Control on Logic Devices in Manufacturing for Sub 0.35 um I–Line", SPIE, vol. 3051, pp. 146–153, Mar. 12–14, 1997.

Lithas, "Lithas: Optical Proximity Correction Software" (2 pages).

Precim, "Proxima System", Precim Company, Portland, Oregon (2 pages).

(List continued on next page.)

Primary Examiner—Matthew Smith
Assistant Examiner—Paul Dinh
(74) Attorney, Agent, or Firm—Park, Vaughan & Fleming LLP

(57) ABSTRACT

An approach to reducing the size of an output file generated by an optical proximity correction (OPC) process is described. An OPC output can be examined to identify identically sized segments with identical biases. Adjoining segments to those first identified to identify repeating basic shapes. Those basic shapes can be further refined and expanded as desired. Finally, the output is rewritten making use of the repeating shapes in a hierarchical output that places each shape once as a child cell of the original geometry and uses references to that shape in other locations thereby reducing data volume size. The data volume savings can be considerable.

32 Claims, 5 Drawing Sheets

U.S. PATENT DOCUMENTS

| | | | |
|---|---|---|---|
| 6,154,563 A | 11/2000 | Tsudaka | 382/144 |
| 6,243,855 B1 | 6/2001 | Kobayashi et al. | 716/19 |
| 6,249,597 B1 | 6/2001 | Tsudaka | 382/144 |
| 6,289,499 B1 | 9/2001 | Rieger et al. | 716/21 |
| 6,298,473 B1 | 10/2001 | Ono et al. | 716/21 |
| 6,339,836 B1 | 1/2002 | Eisenhofer et al. | 716/5 |
| 6,370,679 B1 | 4/2002 | Chang et al. | 716/19 |
| 6,425,117 B1 * | 7/2002 | Pasch et al. | 716/21 |
| 6,453,452 B1 | 9/2002 | Chang et al. | 716/8 |
| 6,453,457 B1 | 9/2002 | Pierrat et al. | 716/19 |
| 6,470,489 B1 * | 10/2002 | Chang et al. | 716/21 |
| 6,560,766 B2 * | 5/2003 | Pierrat et al. | 716/19 |
| 2002/0010904 A1 | 1/2002 | Ayres | 716/19 |
| 2002/0100004 A1 | 7/2002 | Pierrat et al. | 716/5 |
| 2002/0152449 A1 | 10/2002 | Lin | 716/17 |
| 2002/0152454 A1 | 10/2002 | Cote et al. | 716/21 |

OTHER PUBLICATIONS

Precim, "Proxima Wafer Proximity Correction System", Precim Company, Portland, Oregon (2 pages).

Rieger, M., et al., "Mask Fabrication Rules for Proximity–Corrected Patterns", Precim Company, Portland, Oregon (10 pages).

Rieger, M., et al., "Using Behavior Modeling for Proximity Correction", Precim Company, Portland, Oregon (6 pages).

Cobb, et al., "Fast Sparse Aerial Image Calculation for OPC", SPIE, vol. 2621, pp. 534–544, Sep. 20–22, 1995.

Lucas, K., et al., "Model Based OPC for 1st Generation 193nm Lithography", Motorola Inc., IDT assignee to IMEC (12 pages).

Stirniman, J., et al., "Quantifying Proximity and Related Effects in Advanced Wafer Processes", Precim Company, Hewlett Packard Labs (9 pages).

Sugawara, M., et al., "Practical Evaluation of Optical Proximity Effect Correction by EDM Methodology", Sony Corporation (11 pages).

Saleh, B., et al., "Reduction of Errors of Microphotographic Reproductions by Optimal Corrections of Orignial Masks", Optical Engineering, vol. 20, No. 5, pp. 781–784, Sep./Oct. 1981.

Fu, C.C., et al., "Enhancement of Lithographic Patterns by Using Serif Features", IEEE, Transactions On Electron Devices, vol. 38, No. 12, pp. 2599–2603 Dec. 1991.

Harafuji, K., et al., "A Novel Hierarchical Approach for Proximity Effect Correction in Electron Beam Lithography", IEEE, vol. 12, No. 10, pp. 1508–1514, Oct. 1993.

Rieger, M., et al., "System for Lithography Proximity Compensation", Precim Company, Portland, Oregon, Sep. 1993 (28 pages).

Galan, G., et al., "Application of Alternating–Type Phase Shift Mask to Polysilicon Level for Random Logic Circuits", Jpn. J. Appl. Phys., vol. 33, pp. 6779–6784 (1994).

Stirniman, J., et al., "Fast Proximity Correction with Zone Sampling", SPIE, vol. 2197, pp. 294–301 (1994).

Stirniman, J., et al., "Optimizing Proximity Correction for Wafer Fabrication Processes", SPIE, Photomask Technology And Management, vol. 2322, pp. 239–246 (1994).

Stirniman. J., et al., "Wafer Proximity Correction and Its Impact on Mask–Making", Bacus News, vol. 10, Issue 1, pp. 1, 3–7, Jan. 10–12, 1994.

Henderson, R., et al., "Optical Proximity Effect Correction: An Emerging Technology", Microlithography World, pp. 6–12 (1994).

Barouch, E., et al., "OPIMASK: An OPC Algorithm for Chrome and Phase–Shift Mask Design", SPIE, Vo. 2440, pp. 192–206, Feb. 1995.

Cobb, N., et al., "Fast, Low–Complexity Mask Design", SPIE, vol. 2440, pp. 313–327, Feb. 22–24, 1995.

Yen, A., et al., "Characterization and Correction of Optical Proximity Effects in Deep–Ultravoilet Lithography Using Behavior Modeling", J. Vac. Sci. Technol. B, vol. 14, No. 6, pp. 4175–4178, Nov./Dec. 1996.

Morimoto, H., et al., "Next Generation Mask Strategy —Technologies are Ready for Mass Production of 256MDRAM?", SPIE, vol. 3236, pp. 188–189 (1997).

Park, C., et al., "An Automatic Gate CD Control for a Full Chip Scale SRAM Device", SPIE, vol. 3236, pp. 350–357 (1997).

Dolainsky, C., et al., "Application of a Simple Resist Model to Fast Optical Proximity Correction", SPIE, vol. 3051, pp. 774–780 (1997).

Tsujimoto, E., et al., "Hierarchical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Chuang, H., et al., "Practical Applications of 2–D Optial Proximity Corrections for Enhanced Performance of 0.25 um Random Logic Devices", IEEE, pp. 18.7.1–18.7.4, Dec. 1997.

Cobb, N., et al., "Experimental Results on Optical Proximity Correction With Variable Threshold Resist Model", SPIE, vol. 3051, pp. 458–468, Mar. 12–14, 1997.

Asai, N., et al., "Proposal for the Coma Aberration Dependent Overlay Error Compensation Technology", Jpn. J. Appl. Phys., vol. 37, pp. 6718–6722 (1998).

Cobb, N., "Fast Optical and Process Proximity Correction Algorithms for Integrated Circuit Manufacturing", Dissertation, University of California at Berkeley, UMI Microform 9902038 (139 pages).

Toublan, O., et al., "Phase Aware Proximity Correction for Advanced Masks", SPIE, vol. 4000, pp. 160–170, Mar. 1–3, 2000.

Anonymous, "Parameterization For Full Shape And Rule Dependent Dissection", IPCOM000009587D, Sep. 4, 2002 (9 pages).

* cited by examiner

METHOD AND APPARATUS FOR REDUCING OPTICAL PROXIMITY CORRECTION OUTPUT FILE SIZE

BACKGROUND

1. Field of the Invention

The invention relates to the process of designing an integrated circuit. More specifically, the invention relates to a method and an apparatus for reducing the output file size of an optical proximity correction process used in the design of an integrated circuit.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process can begin with the formation of a photoresist layer on the surface of a semiconductor wafer. A mask composed of opaque regions, which are generally formed of chrome, and light-transmissive clear regions (chromeless), which are generally formed of quartz, is then positioned over this photoresist-coated wafer. (Note that the term "mask" as used in this specification is meant to include the term "reticle.") Light is then shone on the mask from a visible light source, an ultraviolet light source, or other electromagnetic radiation source.

This light is reduced and focused through an optical system that contains a number of lenses, filters, and mirrors. The light passes through the clear regions of the mask and exposes the underlying photoresist layer. At the same time, the light is blocked by opaque regions of mask, leaving underlying portions of the photoresist layer unexposed.

The exposed photoresist layer is then developed, typically through chemical removal of the exposed/non-exposed regions of the photoresist layer. The end result is a semiconductor wafer with a photoresist layer having a desired pattern. This pattern can then be used for etching underlying regions of the wafer.

One problem that arises during the optical lithography process is "line end shortening" and "pullback" caused by optical effects. This line end shortening and pullback is due to optical effects that cause the light to expose more of the resist under a line end than under other portions of the line.

In order to compensate for line end shortening, designers often add optical proximity correction (OPC) features, such as "hammer heads," onto line ends. These corrections are then stored within a file that contains descriptions of features in the integrated circuit. Note that the corrections can be stored as differences (deltas) from the original features, or alternatively, as complete polygons for the corrected features. See, e.g., U.S. Pat. No. 6,370,679 for more information on one such implementation. Storing the corrections as differences from the original features has the advantage of maintaining the original feature dimensions and hierarchy within the file, whereas storing the corrected features as polygons removes the original feature dimensions from the file and often result in altered hierarchy. Unfortunately, storing the corrections as differences requires significantly larger amounts of storage (possibly ten to one hundred times more) than the original file.

A file size increase of ten times and above is very typical for the delta output format. Under certain circumstances, when the input file hierarchy is not favorably organized or the hierarchy is poorly managed, OPC can result in many local flattenings of the hierarchy, which may cause up to one hundred or more times file size increase. For example, ten 2 micrometer by 2 micrometer cells with one thousand instances, each such that no instance of the same cell has the same environment in the proximity neighborhood will give up to a one hundred or more times file size increase in delta format. For OPC purpose, the entire area needs to be flattened so consequently the OPC features will have a flat hierarchy.

What is needed is a method and an apparatus for reducing the size of the output file produced by an optical proximity correction process.

SUMMARY

One embodiment of the invention provides a system that facilitates reducing the size of an output file generated by an optical proximity correction (OPC) process. The system operates by first receiving an OPC output from an OPC process. Next, the system examines the OPC output to identify groups of identically sized segments with identical biases. The system then identifies adjoining segments with identical corner joining effects from the groups of identically sized segments. Next, the system creates a basic shape from the nearby segments with identical joining effects, and forms a shape group for the basic shape and adjoining segments. Finally, the system defines a child cell to represent the shape group and uses the child cell to represent different instances of the shape group, thereby reducing the amount of data required to encode the OPC output, thus reducing the OPC output file size.

In a variation on this embodiment, the system creates a transformation for each repetition of the child cell, wherein the transformation can specify a translation and/or rotation of the child cell.

In a variation on this embodiment, the system links the child cell and the transformation for each repetition of the child cell into a current cell.

In a variation on this embodiment, the system patches remaining geometries that have not been included in a shape group into the current cell.

In a variation on this embodiment, forming the shape group involves forming a connected shape group, wherein the connected shape group extends the basic shape to include additional adjacent segments.

In a variation on this embodiment, forming the shape group involves forming a disjoint shape group, wherein the disjoint shape group includes additional segments that are not adjacent.

In a variation on this embodiment, the system forms multiple shape groups from the groups of identical segments and represents each of the multiple shape groups with a different child cell.

In a variation on this embodiment, the system generates an output that includes the multiple shape groups and the remaining basic shapes that do not belong to the multiple shape groups.

DETAILED DESCRIPTION

Computer System

Figure 1:
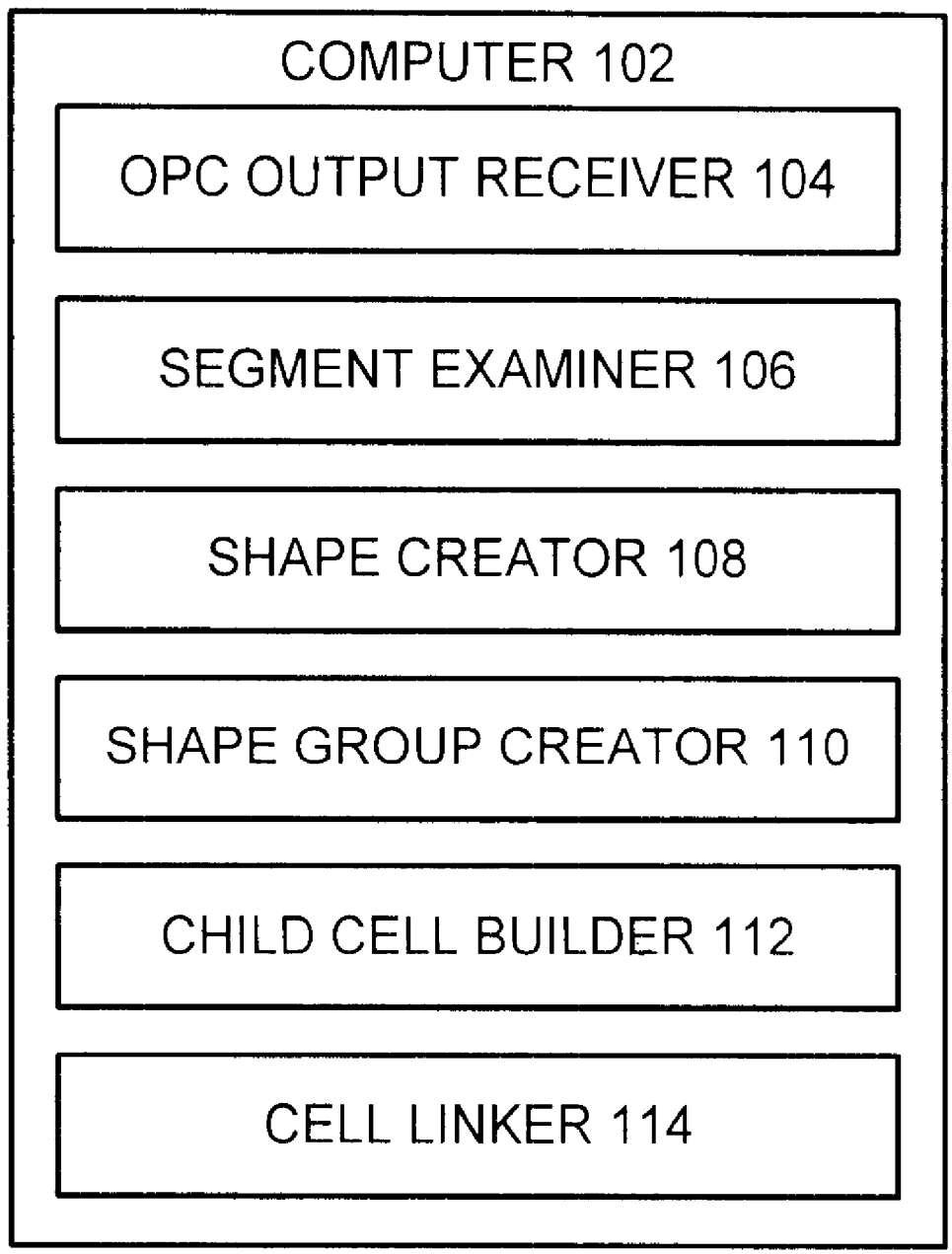
FIG. 1 illustrates a computer in accordance with an embodiment of the invention.

FIG. 1 illustrates a computer 102 in accordance with an embodiment of the invention. Computer 102 can generally include any type of computer system, including, but not limited to, a computer system based on a microprocessor, a mainframe computer, a cluster of computer systems, a multi-processor computer, etc. Computer 102 supports OPC output receiver 104, segment examiner 106, shape creator 108, shape group creator 110, child cell builder 112, and cell linker 114. These are functional components comprised of a combination of hardware and/or software executing on the computer 102. For example, in one embodiment, the OPC output receiver 104 corresponds to a computer program for accessing OPC output across a network interface on the computer 102. In some embodiments, these components may be implemented in a single computer program, e.g. the iN-Tandem™ and/or iN-Phase™ software, both from Numerical Technologies, Inc., of San Jose, Calif., as an extension of the OPC processes of the same and running on computer 102 (not shown) or separate computers (not shown).

OPC output receiver 104 receives the output of an optical proximity correction (OPC) process. This output can include the original shape descriptions plus deltas created by the OPC process, or alternatively, can include polygons that correspond to the original shapes with corrected polygons. Note that this invention applies to either output format.

Segment examiner 106 examines the segments of the features within the output of the OPC process and forms collections of segments having the same size and the same bias. Shape creator 108 then uses these collections to form basic shapes. These basic shapes are determined by first locating adjacent segments with identical corner joining effects and then combining the adjacent segments. Shape group creator 110 extends the basic shapes by adding additional segments to the basic shapes. These additional segments can be adjacent to the basic shape or can be disjoint from the basic shape.

Basic shapes are a collection of adjacent segments that have corner-joining effects with each other and are the smallest unit for a cell. Shape groups are collections of basic shapes that may be either connected or disjoint. Without grouping the basic shapes, each basic shape will end up with a cell to itself and its different placements will each have a transformation. By building a shape group, assuming the placements for each basic shape are the same, the number of cells and transformations and the overhead for cells and cell transformations are reduced.

Child cell builder 112 builds child cells for each shape group and creates transformations for each placement of the shape group. Cell linker 114 then links the placement transformations of the child cells to the current cell, and also patches any remaining geometries in the current cell that are left out by the sum of the linked child cells.

Data Transformations

Figure 2:
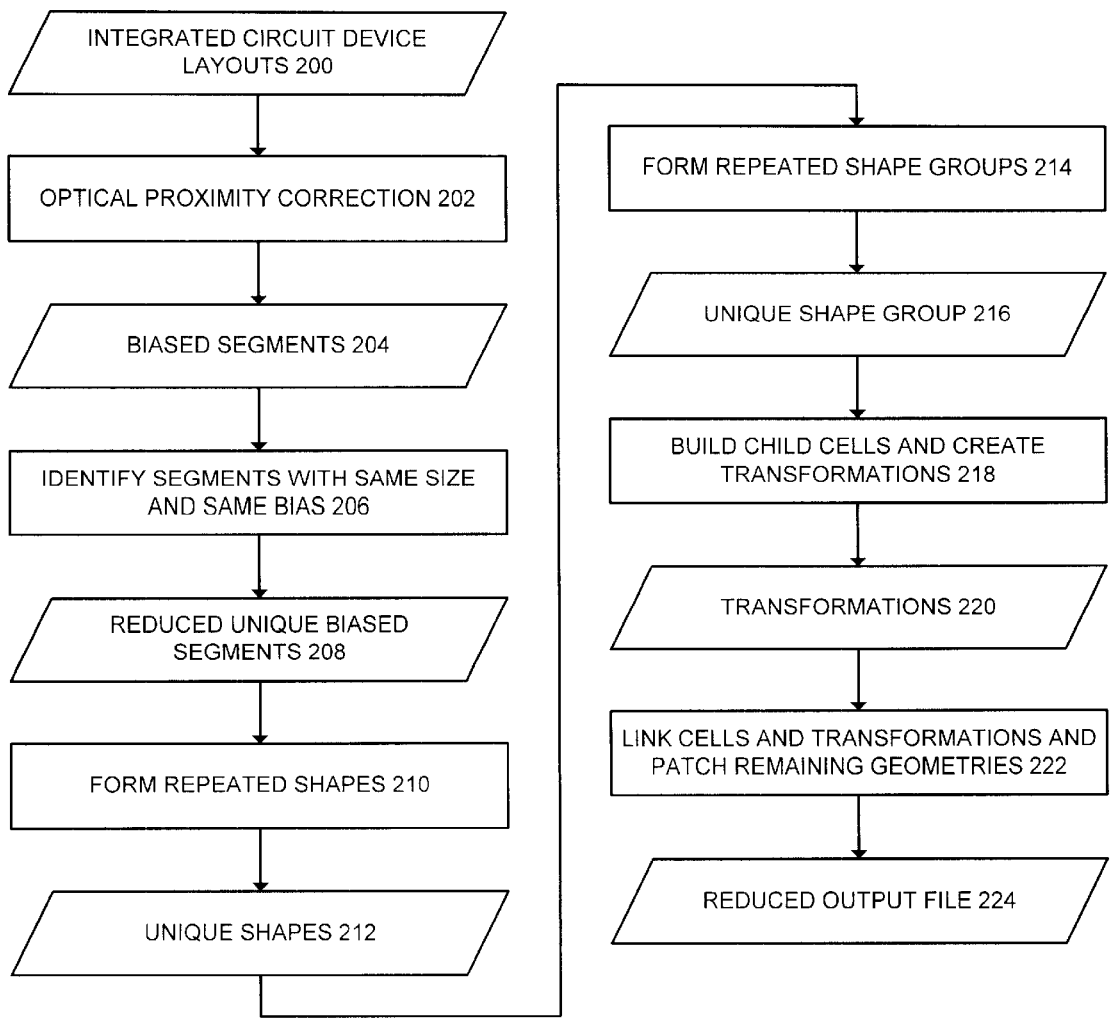
FIG. 2 illustrates data transformations in accordance with an embodiment of the invention.

FIG. 2 illustrates data transformations in accordance with an embodiment of the invention. Integrated circuit device layouts 200 are received and transformed by OPC process 202 into biased segments 204. For example, the layouts 200 could be input in a GDS-II format and the OPC process 202 could generate another GDS-II format file as the biased segments 204. In another embodiment, the biased segments 204 just represent the biases to be applied to segments of the original layout.

Segments with the same size and same bias are identified at 206 to provide reduced unique biased segments 208. For example if there is a first segment of 120 nm with a bias of +5 nm and a second segment of 120 nm with the same bias, +5 nm, then those two segments could be reduced into one at this stage. More specifically, the second segment could be represented (e.g. in the GDS-II output) as a translation and/or rotation of the first segment.

The system then forms repeated shapes from unique biased segments 208 at 210 to produce unique shapes 212. Next, the system forms repeated shape groups at 214 to produce unique shape groups 216.

Next, the system builds child cells and creates transformations for each instance of a shape group at 218 to form unique cells and transformations 220. Finally, the system links the cells and transformations, and patches any remaining geometries at 222 to provide reduced output file 224. Note that reduced output file 224 includes the data for creating a mask for exposing a wafer to create the integrated circuit. In some embodiments the output file 224 is in a standard output format such as GDS-II format.

Forming Shape Groups

Figure 3:
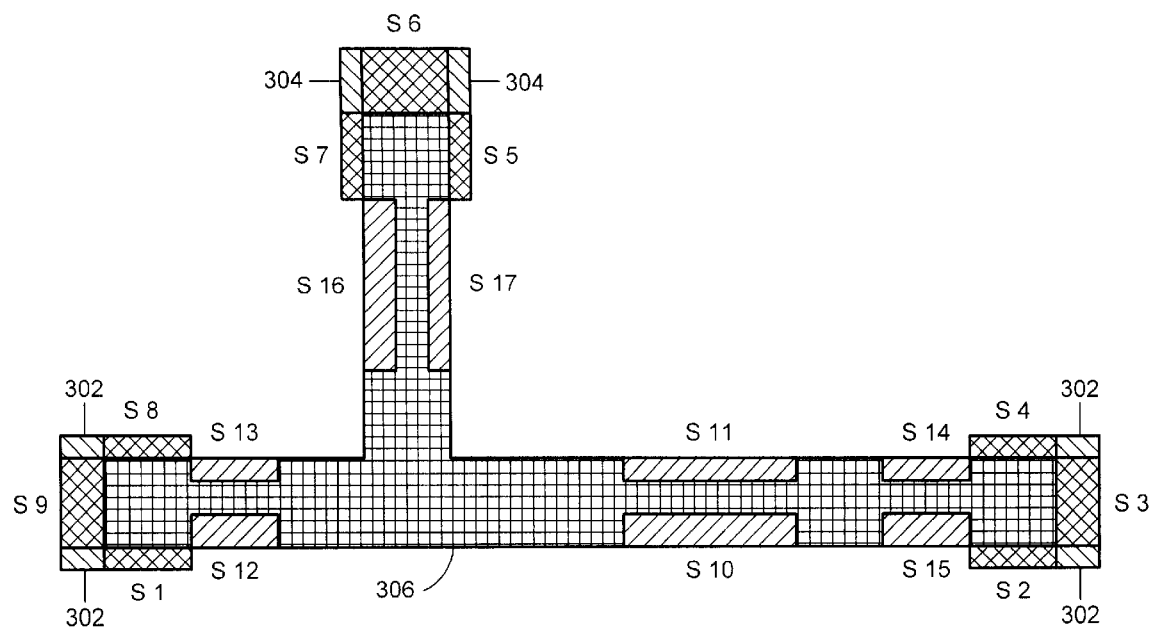
FIG. 3 illustrates forming shape groups in accordance with an embodiment of the invention.

FIG. 3 illustrates the process of forming shape groups in accordance with an embodiment of the invention. Feature 306 is a feature specified for an integrated circuit device before OPC. During OPC, various segments of the feature are biased to account for optical effects during exposure of the feature onto a wafer. These segments are labeled in FIG. 3 as S1 through S17.

During operation, segment examiner 106 first examines the output of the OPC operation to identify and group segments with the same size, e.g. at step 206. For example, in FIG. 3, segment examiner 106 would identify the following set of same-sized segments: {S1, S2, S4, S5, S7, S8}, {S3, S6, S9}, {S12, S13, S14, S15}, and {S10, S11, S16, S17}. Next, segment examiner 106 identifies and groups segments that have the same size and the same bias, also at step 206. This results in the following sets of unique segments: {S1, S2, S4, S5, S7, S8}, {S3, S9}, {S10, S16}, {S11, S17}, {S12, S15}, Shape creator 108 then locates adjoining segments with identical corner joining effects and also locates other segments with identical sizes and biases, e.g. at step 210. Shape creator 108 then creates basic shapes from these segments. For example, S8, S9, and S1 have corner joining effects 302, and S2, S3, and S4 have identical corner joining effects 302. Segments S5, S6, and S7 have different corner joining effects 304. Shape creator 108 forms the following basic shapes and instances of these basic shapes: {S8-S9-S1, S2-S3-S4}, {S5-S6-S7}, {S10, S16}, {S11, S17}, {S12, S15}, and {S13, S14}.

Basic shapes are always comprised of connected segments, so basic shapes are readily available from the unique segments data. Extending basic shapes with connected segments is also relatively easy. Building disjoint shapes groups however is more complex. Ideally the shape groups should be built such that they minimize the overall data volume, but this is very difficult to achieve. A realistic algorithm, such as matching disjoint shapes by proximity, should be used. i.e., for each connected shape group, search in the shape group's neighborhood for other shape groups that may combine with it to build disjoint shape groups.

Next, shape group creator 110 forms connected shape groups and disjoint shape groups from these basic shapes by first adding adjacent identical segments to the basic shapes and then by identifying disjoint basic shapes that have identical relative positions with each other, e.g. at step 214. More specifically, shape group creator 110 forms connected shape groups {S13-S8-S9-S11-S12, S15-S2-S3-S4-S14}, and disjoint shape groups {S10-S11, S16-S17} from the basic shapes. As described above, this problem is not easy to solve and there is no best algorithm for solving the problem. One viable implementation is the aforementioned neighborhood search technique.

Child Cells and Transformations

Figure 4:
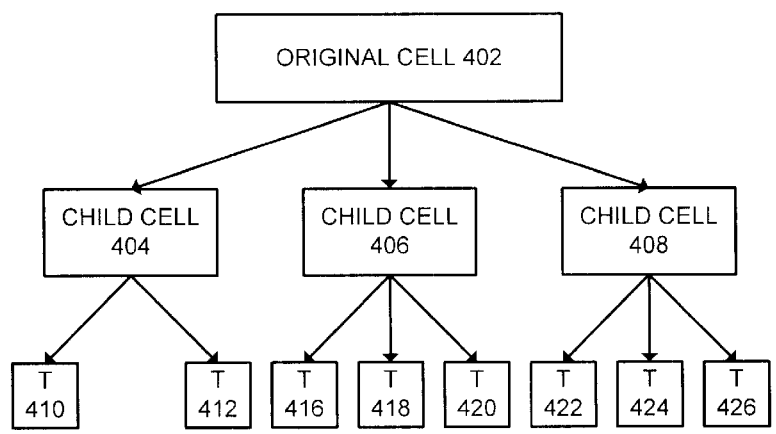
FIG. 4 illustrates child cells and transformations in accordance with an embodiment of the invention.

FIG. 4 illustrates child cells and transformations in accordance with an embodiment of the invention. Original cell 402 includes data related to the feature described in the integrated circuit layout. If the system is using a delta format as described above, original cell 402 can include the original layout data. On the other hand, if the system is using polygon format, original cell 402 can include portions of the original layout data that have not been included in the child cells.

Child cells 404, 406, and 408 include data related to different shape groups. For example, child cell 404 might include data related to the shape group {S13-S8-S9-S1-S12}. Note that there are two instances of this shape group: {S13-S8-S9-S1-S12}, and {S15-S2-S3-S4-S14}. These two instances correspond to transformations T 410 and T 412 as described below.

Each child cell can be associated with multiple transformations, wherein each transformation can specify a translation and a rotation for the child cell. More specifically, in FIG. 4, child cell 404 is associated with transformations T 410 and 412; child cell 406 is associated with transformations T 416, 418, and 420; and child cell 408 is associated with transformations T 422, 424, and 426. Note that each child cell can have more or fewer transformations than are shown in FIG. 4.

In the example described above for child cell 404, there are two transformations; one for the shape group instance {S13-S8-S9-S1-S12}, and one for the shape group instance {S15-S2-S3-S4-S14}. Note that storing data only once for a shape group and then creating transformations for each instance of the shape group results in significant saving of storage space for the output of the system if the shape group contains a large amount of data and is repeated many times.

Building Child Cells

Figure 5:
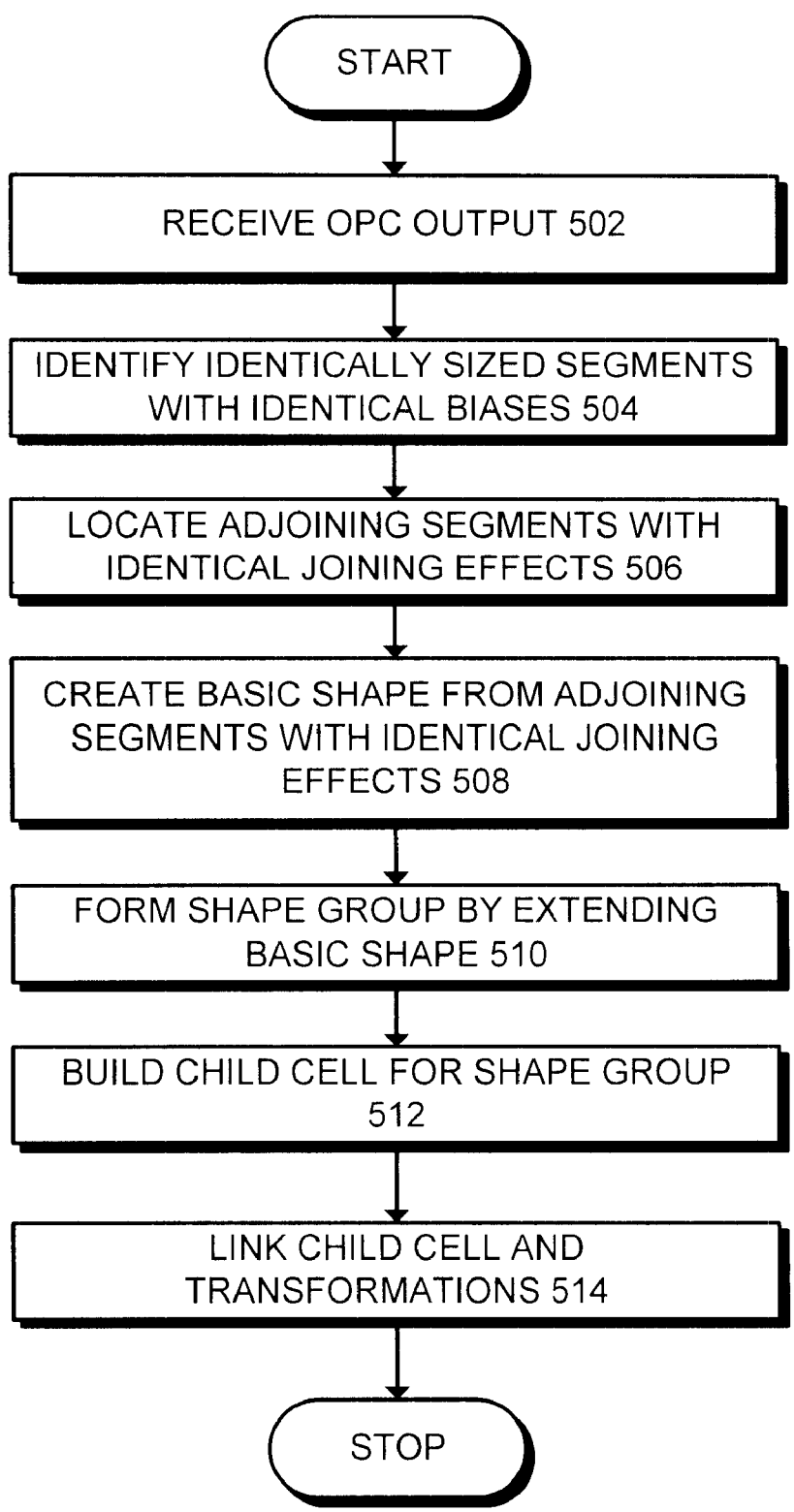
FIG. 5 is a flowchart illustrating how to build child cells in accordance with an embodiment of the invention.
Figure 7:
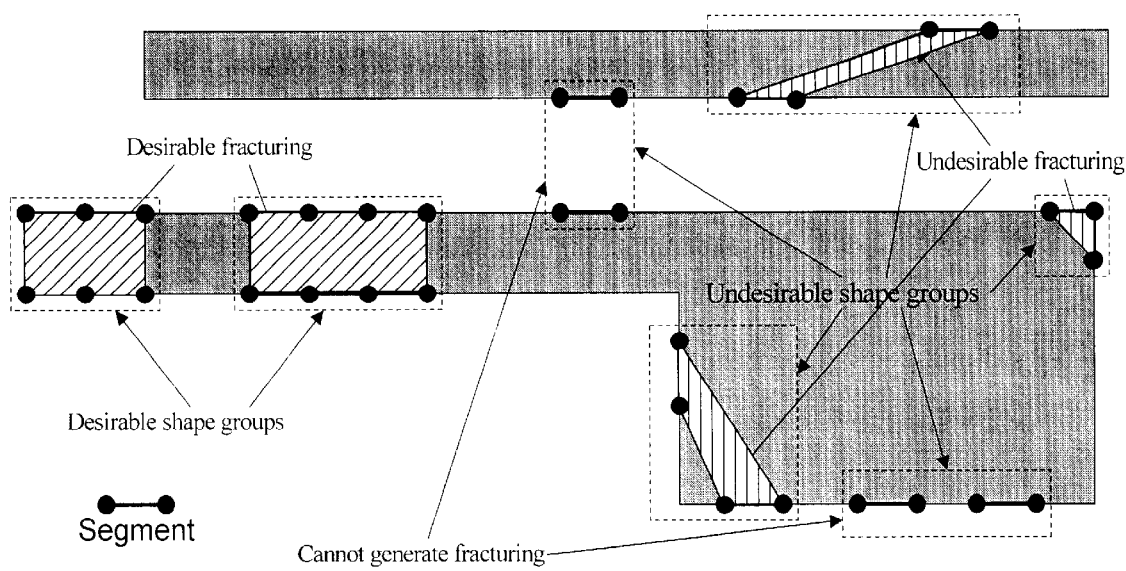
FIG. 7 illustrates shape groups and fracturing in accordance with an embodiment of the invention.

FIG. 5 is a flowchart illustrating the process of building child cells in accordance with an embodiment of the invention at steps 218 and 222 of FIG. 2. The system starts when OPC output receiver 104 receives the output from an OPC process (step 502). Next, segment examiner 106 identifies identically sized segments with identical biases (step 504). For polygon output mode, the process is slightly complicated as the output geometries consist partially of the input geometries. It is important that by building shape groups that there are not too many extra vertices created. One requirement is that the shape group should create a desirable fracturing of the geometry. Refer to FIG. 7 for an illustration of areas of desirable fracturing and undesirable fracturing.

Shape creator 108 then locates groups of adjoining segments with identical corner joining effects (step 506). Shape creator 108 then creates basic shapes from these adjoining segments (step 508). Next, shape group creator 110 forms shape groups by extending the basic shapes (step 510).

Child cell builder 112 then builds child cells for each unique shape group and builds transformations for each instance of each unique shape (step 512). Finally, cell linker 114 links the child cells to the related original cells and links the transformations to the related child cells (step 514).

Figure 6:
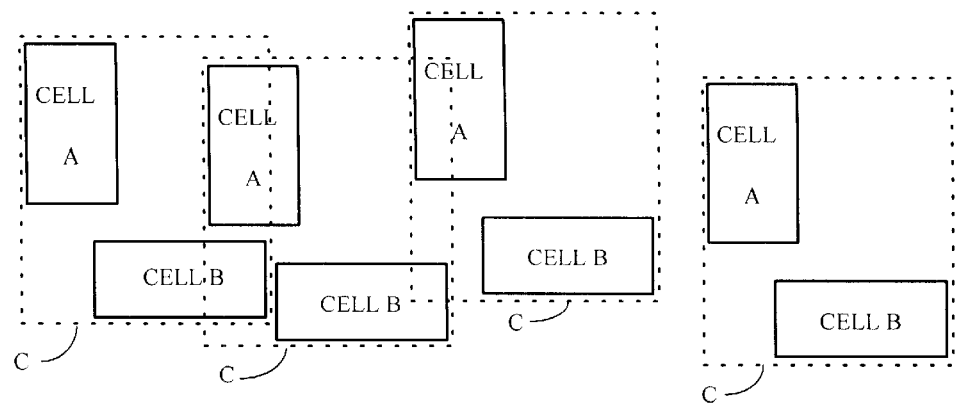
FIG. 6 illustrates grouping cells in accordance with an embodiment of the invention.

FIG. 6 illustrates grouping cells in accordance with an embodiment of the invention. As shown in FIG. 6, cell A and cell B are repeated multiple times with the relative positions of cell A and cell B remaining constant with respect to each other. Combining cell A and cell B into cell C as shown by the dashed lines can provide storage savings. Without combining cell A with cell B, the size required to represent the data is:

data(A)+overhead(A)+n*translation(A)+data(B)+overhead(B)+n*translation(B).

After combining A and B into C, the size required to represent the data is:

data(C)+overhead(C)+n*translation(C).

Considering that data(C)=data(A)+data(B) and that both overhead(A)=overhead(C) and translation(A)=translation(C), this gives an overall savings in data of overhead(B)+n*translation(B). Moreover when A and B share a piece of geometry, additional vertices could be created by fragmenting the data, thereby making data(A)+data(B)>data(C). In such a case, the savings from combining A and B into C can be even greater.

In some instances, when A appears in some other locations without the accompanying B, it is desirable to maintain individual cells A and B and create the cell C as the parent cell of A+B. This creates some extra overhead for cell C, but avoids the cost of building another cell, e.g. A', that shares pointers of the data of C.

Switching from a flat representation to a hierarchical representation is done when the savings from reduced data (polygon vertices) exceeds the cost of the cell overhead plus the transformation. For a simple one-level hierarchy, the formula for file size is roughly:

$$F = \sum_{i=1}^{N} (g_i + o_i + r_i \times t_i)$$

where:
N=number of cells
$g_i$=geometry size of cell i (proportional to number of vertices)
$o_i$=cell overhead of cell i
$r_i$=repetition of cell i
$t_i$=transformation overhead for cell I
To simplify, assume the cell overhead, transformation overhead, and cell repetition are the same, the above formula simplifies to:

$$F = (o + r \times t) \times \frac{N(N+1)}{2} + \sum_{i=1}^{N} g_i$$

Also assuming the geometry size of the combined cell is the same as that of all cells combined, the larger the number of cells N, the larger the size of the data. In the above formula, when N=1, then F=o+r×t+g. Notice that o and t are fairly constant, whereas r~1/g. That is, if two cells are combined into one, r is reduced by ½, but g will double. So whether F will increase or decrease depends on the size of r×t compared with g. If r×t>2g, there is a benefit to combine the cells.

The preceding description is presented to one to make and use the invention, and is provided in the context of a particular application and its requirements. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet and the carrier wave may include programs for performing the processes access across the network.

The foregoing descriptions of embodiments of the invention have been presented for purposes of illustration and description only. They are not intended to be exhaustive or to limit the invention to the forms disclosed. The scope of the invention is defined by the appended claims.

What is claimed is:

1. A method for reducing an optical proximity correction (OPC) output file size, comprising:
    receiving an OPC output from an OPC process;
    examining the OPC output to identify groups of identically sized segments with identical biases;
    identifying adjoining segments with identical joining effects from the groups of identically sized segments;
    creating a basic shape from the adjoining segments with identical joining effects;
    forming a shape group from the basic shape, wherein forming the shape group involves adding additional shapes to the basic shape;
    defining a child cell to represent the shape group; and
    using the child cell to represent different instances of the shape group, thereby reducing the OPC output file size.

2. The method of claim 1, further comprising creating a transformation for each repetition of the child cell, wherein the transformation can specify a translation and/or rotation of the child cell.

3. The method of claim 2, further comprising linking the child cell and the transformation for each repetition of the child cell into a current cell.

4. The method of claim 3, further comprising patching remaining geometries into the current cell.

5. The method of claim 1, wherein forming the shape group involves forming a connected shape group, wherein the connected shape group includes extending the basic shape to include additional adjacent segments.

6. The method of claim 1, wherein forming the shape group includes forming a disjoint shape group, wherein the disjoint shape group includes additional segments that are not adjacent.

7. The method of claim 1, further comprising:
    forming multiple shape groups from the group of identical segments; and
    representing each of the multiple shape groups with a different child cell.

8. The method of claim 7, further comprising generating an output, wherein the output includes the multiple shape groups and remaining basic shapes that do not belong to the multiple shape groups.

9. A computer-readable storage medium storing instructions that when executed by a computer cause the computer to perform a method for reducing an optical proximity correction (OPC) output file size, the method comprising:
    receiving an OPC output from an OPC process;
    examining the OPC output to identify groups of identically sized segments with identical biases;
    identifying adjoining segments with identical joining effects from the groups of identically sized segments;
    creating a basic shape from the adjoining segments with identical joining effects;
    forming a shape group from the basic shape, wherein forming the shape group involves adding additional shapes to the basic shape;
    defining a child cell to represent the shape group; and
    using the child cell to represent different instances of the shape group, thereby reducing the OPC output file size.

10. The computer-readable storage medium of claim 9, the method further comprising creating a transformation for each repetition of the child cell, wherein the transformation can specify a translation and/or rotation of the child cell.

11. The computer-readable storage medium of claim 10, the method further comprising linking the child cell and the transformation for each repetition of the child cell into a current cell.

12. The computer-readable storage medium of claim 11, the method further comprising patching remaining geometries into the current cell.

13. The computer-readable storage medium of claim 9, wherein forming the shape group involves forming a connected shape group, wherein the connected shape group includes extending the basic shape to include additional adjacent segments.

14. The computer-readable storage medium of claim 9, wherein forming the shape group includes forming a disjoint shape group, wherein the disjoint shape group includes additional segments that are not adjacent.

15. The computer-readable storage medium of claim 9, the method further comprising:
    forming multiple shape groups from the group of identical segments; and
    representing each of the multiple shape groups with a different child cell.

16. The computer-readable storage medium of claim 15, the method further comprising generating an output, wherein the output includes the multiple shape groups and remaining basic shapes that do not belong to the multiple shape groups.

17. An apparatus for reducing an optical proximity correction (OPC) output file size, comprising:
    a receiving mechanism that is configured to receive an OPC output from an OPC process;
    an examining mechanism that is configured to examine the OPC output to identify groups of identically sized segments with identical biases;
    an identifying mechanism that is configured to identify adjoining segments with identical joining effects from the groups of identically sized segments;

a creating mechanism that is configured to create a basic shape from the adjoining segments with identical joining effects;

a forming mechanism that is configured to form a shape group from the basic shape, wherein forming the shape group involves adding additional shapes to the basic shape;

a defining mechanism that is configured to define a child cell to represent the shape group; and a representing mechanism that is configured to use the child cell to represent different instances of the shape group, thereby reducing the OPC output file size.

18. The apparatus of claim 17, wherein the creating mechanism is further configured to create a transformation for each repetition of the child cell, wherein the transformation can specify a translation and/or rotation of the child cell.

19. The apparatus of claim 18, further comprising a linking mechanism that is configured to link the child cell and the transformation for each repetition of the child cell into a current cell.

20. The apparatus of claim 19, further comprising a patching mechanism that is configured to patch remaining geometries into the current cell.

21. The apparatus of claim 17, wherein forming the shape group involves forming a connected shape group, wherein the connected shape group includes extending the basic shape to include additional adjacent segments.

22. The apparatus of claim 17, wherein forming the shape group includes forming a disjoint shape group, wherein the disjoint shape group includes additional segments that are not adjacent.

23. The apparatus of claim 17;
wherein the forming mechanism is further configured to form multiple shape groups from the group of identical segments; and
further comprising a representing mechanism that is configured to represent each of the multiple shape groups with a different child cell.

24. The apparatus of claim 23, further comprising a generating mechanism that is configured to generate an output, wherein the output includes the multiple shape groups and remaining basic shapes that do not belong to the multiple shape groups.

25. A system for reducing an optical proximity correction (OPC) output file size, comprising:

a receiving means for receiving an OPC output from an OPC process;

an examining means for examining the OPC output to identify groups of identically sized segments with identical biases;

an identifying means for identifying adjoining segments with identical joining effects within the groups of identically sized segments;

a basic shape creating means for creating a basic shape from adjoining segments with identical joining effects;

a shape group forming means for forming a shape group from the basic shape, wherein forming the shape group involves adding additional shapes to the basic shape;

a defining means for defining a child cell to represent the shape group; and a representing means for representing different instances of the shape group, thereby reducing the OPC output file size.

26. The system of claim 25, further comprising a transformation creating means for creating a transformation for each repetition of the child cell, wherein the transformation can specify a translation and/or rotation of the child cell.

27. The system of claim 26, further comprising a linking means for linking the child cell and the transformation for each repetition of the child cell into a current cell.

28. The system of claim 27, further comprising a patching means for patching remaining geometries into the current cell.

29. The system of claim 25, wherein forming the shape group involves forming a connected shape group, wherein the connected shape group includes extending the basic shape to include additional adjacent segments.

30. The system of claim 25, wherein forming the shape group includes forming a disjoint shape group, wherein the disjoint shape group includes additional segments that are not adjacent.

31. The system of claim 25, further comprising:
a forming means for forming multiple shape groups from the group of identical segments; and
a representing means for representing each of the multiple shape groups with a different child cell.

32. The system of claim 31, further comprising a generating means for generating an output, wherein the output includes the multiple shape groups and remaining basic shapes that do not belong to the multiple shape groups.

* * * * *